US008860102B2

(12) United States Patent
Tanaka (10) Patent No.: US 8,860,102 B2
(45) Date of Patent: Oct. 14, 2014

(54) SOLID STATE IMAGING DEVICE AND IMAGING APPARATUS

(71) Applicant: FUJIFILM Corporation, Tokyo (JP)

(72) Inventor: Shunsuke Tanaka, Saitama (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/226,336

(22) Filed: Mar. 26, 2014

(65) Prior Publication Data

US 2014/0203331 A1 Jul. 24, 2014

Related U.S. Application Data

(63) Continuation of application No. PCT/JP2012/070662, filed on Aug. 14, 2012.

(30) Foreign Application Priority Data

Sep. 27, 2011 (JP) ................................. 2011-211337

(51) Int. Cl.
  *H01L 31/062* (2012.01)
  *H01L 31/113* (2006.01)
  *H01L 27/146* (2006.01)
  *H01L 27/148* (2006.01)

(52) U.S. Cl.
  CPC .... *H01L 27/14636* (2013.01); *H01L 27/14627* (2013.01); *H01L 27/14625* (2013.01); *H01L 27/14806* (2013.01); *H01L 27/14609* (2013.01); *H01L 27/14621* (2013.01); *H01L 27/14612* (2013.01)
  USPC .............. 257/294; 257/98; 257/204; 438/70; 438/199

(58) Field of Classification Search
  CPC .................. H01L 27/14612; H01L 27/14609; H01L 27/14643; H01L 27/14627; H01L 27/14625; H01L 27/14621
  USPC ....................... 257/98, 204, 294; 438/70, 199
  See application file for complete search history.

(56) References Cited

U.S. PATENT DOCUMENTS 6,046,466 A * 4/2000 Ishida et al. ................... 257/258
6,674,470 B1 * 1/2004 Tanaka et al. ................. 348/302

(Continued)

FOREIGN PATENT DOCUMENTS

| JP | 2008-10544 A | 1/2008 |
| JP | 2008-108918 A | 5/2008 |
| JP | 2011-40647 A | 2/2011 |
| JP | 2011-86888 A | 4/2011 |

OTHER PUBLICATIONS

International Search Report mailed on Sep. 25, 2012, issued in PCT/JP2001070662.
Written Opinion of the International Searching Authority mailed on Sep. 25, 2012, issued in PCT/JP2001070662.

*Primary Examiner* — Nicholas Tobergte
(74) *Attorney, Agent, or Firm* — Birch, Stewart, Kolasch & Birch, LLP (57) ABSTRACT

A solid-state imaging device has, in a semiconductor substrate, plural PDs arranged two-dimensionally and signal reading circuits which are formed as MOS transistors and read out signals corresponding to charges generated in the respective PDs. Microlenses for focusing light beams are formed over the respective PDs. An interlayer insulating film in which interconnections are buried is formed as an insulating layer between the semiconductor substrate and the microlenses. Closed-wall-shaped structures are formed in the interlayer insulating film so as to surround parts of focusing optical paths of the microlenses, respectively. The structures are made of a nonconductive material that is different in refractive index from a material of what is formed around them.

5 Claims, 9 Drawing Sheets

(56) References Cited

U.S. PATENT DOCUMENTS

| | | | |
|---|---|---|---|
| 7,119,319 B2 * | 10/2006 | Noto et al. | 250/208.1 |
| 7,538,374 B2 * | 5/2009 | Kim | 257/294 |
| 7,768,088 B2 * | 8/2010 | Fukunaga | 257/436 |
| 8,625,058 B2 * | 1/2014 | Kozuma et al. | 349/106 |
| 2010/0230583 A1 | 9/2010 | Nakata et al. | |

* cited by examiner

SOLID STATE IMAGING DEVICE AND IMAGING APPARATUS

CROSS REFERENCE TO RELATED APPLICATION

This is a continuation of International Application No. PCT/JP2012/070662 filed on Aug. 14, 2012, and claims priority from Japanese Patent Application No. 2011-211337 filed on Sep. 27, 2011, the entire disclosure of which is incorporated herein by reference.

TECHNICAL FIELD

The present invention relates to a solid-state imaging device and an imaging apparatus.

BACKGROUND ART

CMOS (complementary metal oxide semiconductor) image sensors and CCD (charge-coupled device) image sensors are known as solid-state imaging devices used in digital cameras and cameras for cellphones. Among those image sensors, CMOS image sensors are image sensors that use MOS transistors to read out signals that correspond to charges stored in photoelectric conversion elements such as photodiodes. In CMOS image sensors, in general, power lines and signal lines for switching are formed over a semiconductor substrate in plural layers (refer to Patent document 1).

In recent years, marked advancements have been made in the pixel size reduction with increase in the number of pixels. How to increase the light collection efficiency is now an important issue. The light collection efficiency can be increased by focusing light entering a solid-state imaging device on photodiodes by means of microlenses. However, the miniaturization of pixels has made the optical designing of microlenses difficult. Furthermore, in CMOS image sensors, if the focal length is increased, incident light is reflected diffusely by a light shield film and wiring layers formed over the photodiodes and resulting reflection light become factors in lowering the uniformity of the sensitivities of the respective pixels. On the other hand, if the focal length is shortened, light comes to shine on portions other than the photodiodes, which makes it difficult to increase the light collection efficiently sufficiently.

In view of the above, Patent document 1 proposes a solid-state imaging device in which ring-shaped metal members which functions as waveguides are formed over photodiodes (over a semiconductor substrate) in the same layer as a wiring layer. These ring-shaped metal members are not in contact with the semiconductor substrate or any other interconnections but are completely buried in an interlayer insulating film. This solid-state imaging device makes it possible to manufacture a solid-state imaging device that is high in light collection efficiently at a low cost because waveguides can be formed by the same process as interconnections.

PRIOR ART DOCUMENTS

Patent Documents

Patent document 1: JP-A-2011-40647

SUMMARY OF THE INVENTION

Problems to Be Solved by the Invention

As described above, the solid-state imaging device disclosed in Patent document 1 is configured in such a manner that the ring-shaped metal members are formed in the same layer as a wiring layer. However, in recent CMOS image sensors in which the aperture areas of the photodiodes have been decreased much due to miniaturization, regions where the ring-shaped metal members can be formed have also decreased. And interconnections are formed around these regions. That is, in CMOS image sensors that are miniaturized to a very large extent, in the case where the metal rings are formed in the same layer as a wiring layer, necessary distances cannot be secured between the rings and the other interconnections. As a result, capacitances between interconnections are increased to disable high-speed driving. Various conductive members (e.g., transistor gate electrodes) exist over the photodiodes not only in layers in which interconnections are formed. Therefore, the above problems arise not only in the case where the metal rings are formed over the photodiodes in the same layer as interconnections but also in the case where the metal rings are formed over the photodiodes in a wiring layer.

The present invention has been made in the above circumstances, and an object of the present invention is therefore to provide a solid-state imaging device which can be driven at high speed while realizing high uniformity of sensitivities and highlight collection efficiency as well as an imaging apparatus incorporating such a solid-state imaging device.

Means for Solving the Problems

A solid-state imaging device according to the invention having plural photoelectric conversion portions arranged two-dimensionally in a semiconductor substrate, and signal reading circuits formed as MOS transistors in the semiconductor substrate, for reading out signals corresponding to charges generated in the plural respective photoelectric conversion portions, comprises microlenses formed over the plural respective photoelectric conversion portions, for focusing light beams on the respective photoelectric conversion portions; an insulating layer which is formed between the semiconductor substrate and the microlenses and in which interconnections are buried; and closed-wall-shaped structures disposed in the insulating layer so as to surround parts of optical paths of light beams focused by the microlenses, respectively, wherein a width of each of the closed-wall-shaped structures in a direction parallel with a surface of the semiconductor substrate is greater than its height in a direction perpendicular to the semiconductor substrate; and wherein the closed-wall-shaped structures are made of a non-conductive material that is different in refractive index from a material of what is formed around them.

An imaging apparatus according to the invention comprises the above solid-state imaging device.

Advantages of the Invention

The invention can provide a solid-state imaging device which can be driven at high speed while realizing high uniformity of sensitivities and high light collection efficiency as well as an imaging apparatus incorporating such a solid-state imaging device.

MODES FOR CARRYING OUT THE INVENTION

An embodiment of the present invention will be hereinafter described with reference to the drawings.

Figure 1:
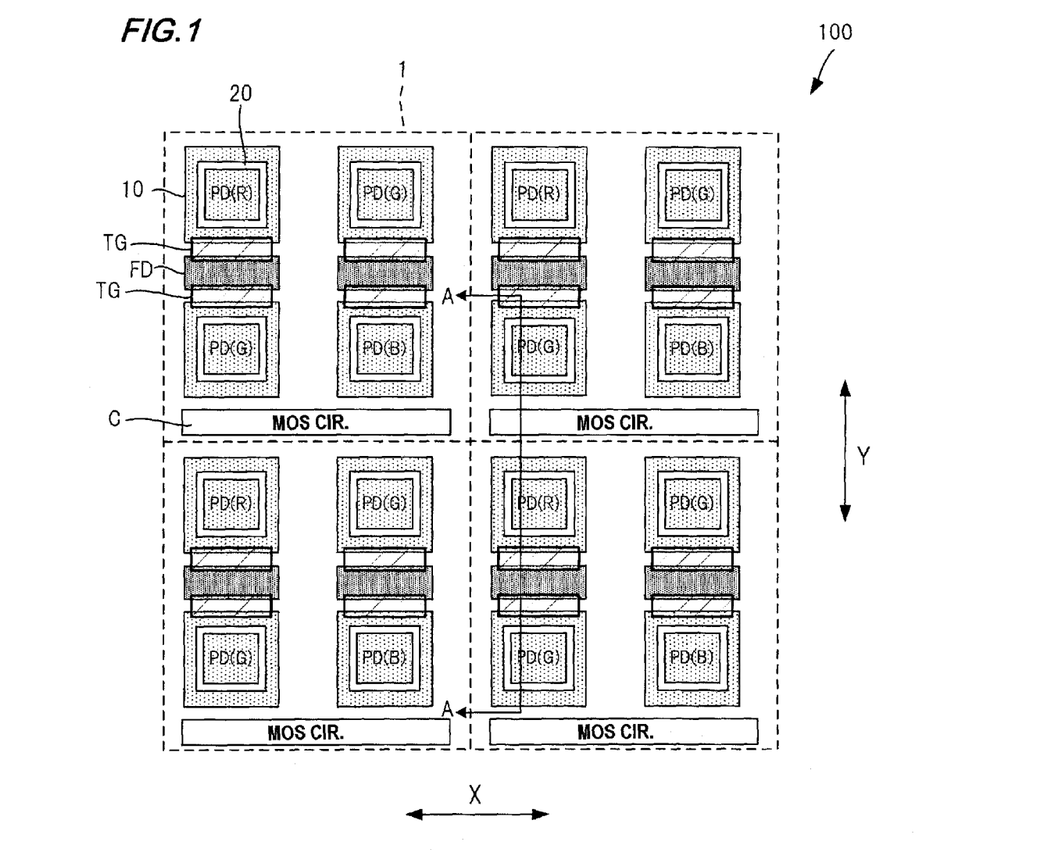
FIG. 1 is a schematic plan view showing a general configuration of a MOS solid-state imaging device for description of an embodiment of the invention.

FIG. 1 is a schematic plan view showing a general configuration of a MOS solid-state imaging device for description of the embodiment of the invention. For example, the solid-state imaging device to be described in the embodiment is used being incorporated in an imaging apparatus such as a digital camera or a digital video camera or an imaging module incorporated in an electronic endoscope, a cellphone with a camera, or the like.

The solid-state imaging device 100 is equipped with plural photoelectric conversion portions (photodiodes: PDs) 10 which are arranged two-dimensionally (in the example of FIG. 1, in square lattice form) in a semiconductor substrate and signal reading circuits (expressed as "MOS cir." in FIG. 1) C which are MOS transistors for reading signals corresponding to charges stored in the respective PDs 10 to the outside. Sixteen of the plural PDs 10 incorporated in the solid-state imaging device 100 are shown in FIG. 1.

In the solid-state imaging device 100, one signal reading circuit C is provided for each set of four PDs 10. Four PDs 10 and the corresponding signal reading circuit C are formed in each rectangular shared pixel region 1. The solid-state imaging device 100 is formed in such a manner that shared pixel regions 1 are arranged in square lattice form.

A floating diffusion FD as a charge storage portion to which charges stored in the two PDs 10 are transferred are formed in the semiconductor substrate between the two PDs 10 that are adjacent to each other in the column direction Y.

A gate electrode TG is formed over the semiconductor substrate between the floating diffusion FD and each of the PDs 10 that are adjacent to the floating diffusion FD in the column direction Y. A transfer transistor is formed by each PD 10, the floating diffusion FD adjacent to it, and the gate electrode TG between them. Charge transfer from each PD 10 to the floating diffusion FD can be controlled by controlling a pulse that is supplied to the associated gate electrode TG.

A signal reading circuit C is formed adjacent to, in the column direction Y, the two bottom PDs 10 among the four PDs 10 included in each shared pixel region 1 so as to be located adjacent to the bottom sideline of the shared pixel region 1.

For example, in each shared pixel region 1, the signal reading circuit C is made up of a reset transistor for resetting a potential of each floating diffusion FD, an output transistor for outputting a signal corresponding to a potential of each floating diffusion FD, and a row-selection transistor for selectively outputting, to signal output lines, a signal that is output from the output transistor. In each shared pixel region 1, each floating diffusions FD is connected to the source of the reset transistor and the gate electrode of the output transistor.

A closed-wall-shaped structure 20 is formed over each PC 10. The closed-wall-shaped structure 20 will be described later in detail.

Plural kinds of color filters are formed over the respective PDs 10. The color filters are arranged in mosaic form (in the example of FIG. 1, in Bayer form). In FIG. 1, each PD 10 over which an R filter which transmits red light is laid is given a character "(R)." Each PD 10 over which a G filter which transmits green light is laid is given a character "(G)." Each PD 10 over which a B filter which transmits blue light is laid is given characters "(B)."

Figure 2:
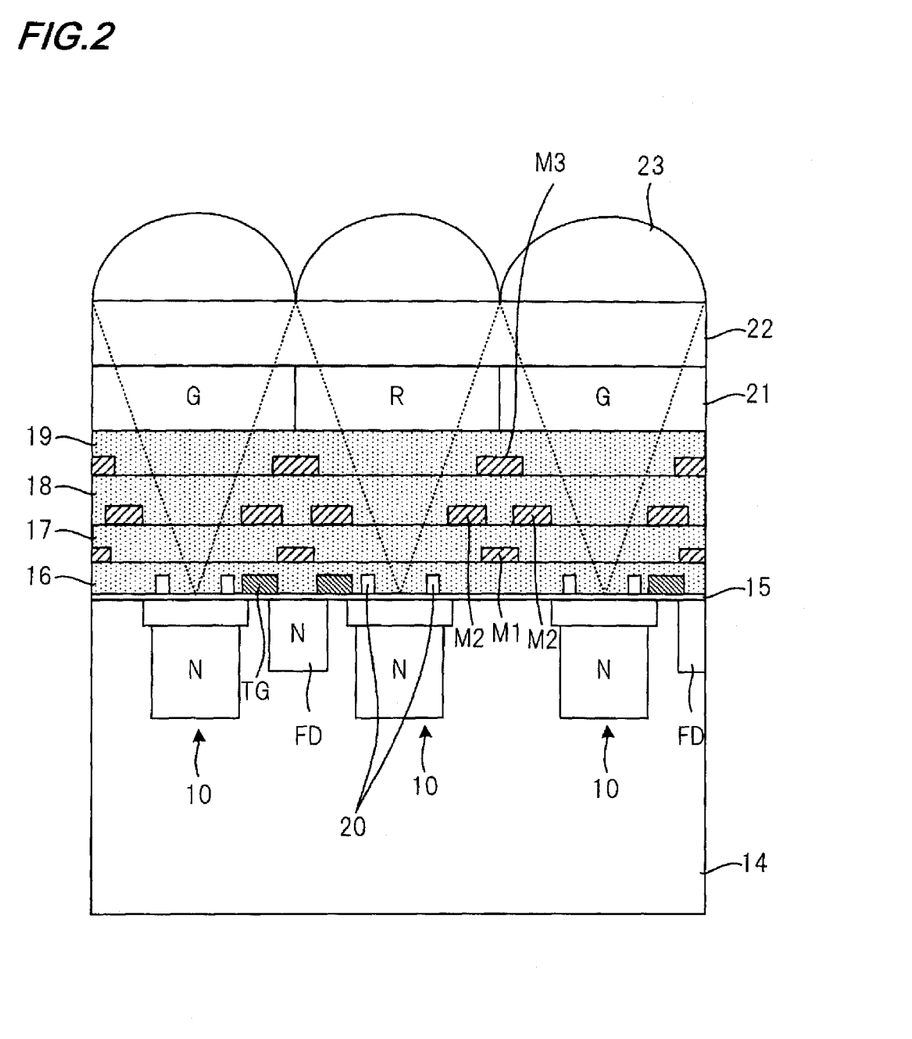
FIG. 2 is a schematic sectional view taken along line A-A in FIG. 1.

FIG. 2 is a schematic sectional view taken along line A-A in FIG. 1. The signal reading circuits C shown in FIG. 1 are omitted in FIG. 2.

As shown in FIG. 2, a gate insulating film 15 is formed on a semiconductor substrate 14 which consists of an n-type semiconductor substrate and a p-well layer formed therein. Interlayer insulating films 16, 17, 18, and 19 are formed in this order on the gate insulating film 15. The interlayer insulating films 16-19 constitute insulating layers (hereinafter referred to as wiring layers) in which interconnections are buried. The color filters 21 are formed on the interlayer insulating film 19 at such positions as to be opposed to the respective PDs 10. Microlenses 23 are formed over the respective color filters 21 with a flattening film 22 formed in between. The microlenses 23 serve to focus light on the respective PDs 10, and are designed so that, for example, their focal points are located in the topmost surfaces of the PDs 10, respectively.

The PDs 10 (n-type impurity layers) are formed in the p-well layer of the semiconductor substrate 14. The floating diffusion FD corresponding to the two left-hand PDs 10 of the three PDs 10 shown in FIG. 2 is formed between these two PDs 10.

The gate electrodes TG are formed over the semiconductor substrate 14 with the gate insulating film 15 interposed in between, between the floating diffusion FD and the corresponding PDs 10. The gate electrodes TG are made of a material (e.g., polysilicon) whose light transmittance varies with the wavelength of incident light.

The closed-wall-shaped structures 20 are formed over the respective PDs 10 with the gate insulating film 15 interposed in between. Each closed-wall-shaped structure 20 is disposed so as to surround part of the optical path (i.e., the region enclosed by two broken lines extending from the ends of the microlens 23 shown in FIG. 2 and the bottom surface of the microlens 23) of light that is focused by the microlens 23 corresponding to the PD 10. The width of each closed-wall-shaped structure 20 in the direction parallel with the surface of the semiconductor substrate 14 (a maximum width in a plan view) is greater than its height in the direction perpendicular to the semiconductor substrate 14. That is, the closed-wall-shaped structures 20 are much different in width-height aspect ratio from waveguides that are incorporated in general CMOS image sensors.

The closed-wall-shaped structure 20 and the gate electrodes TG are formed in the same layer (plane). The closed-wall-shaped structure 20 and the gate electrodes TG are buried in the interlayer insulating film 16 which is an oxide film such as a silicon oxide film.

The structures 20 shown in FIGS. 1 and 2 are made of a material that is different in refractive index from the interlayer insulating film 16. Because of this difference in refractive index, light is reflected totally by the inner circumferential surface and the outer circumferential surface of each structure 20. For example, the structures 20 are formed by patterning a nitride film such as a silicon nitride film. Because of the difference in refractive index, light entering the hollow portion of each structure 20 is guided to the PD 10 while being totally reflected repeatedly by the interface between the interlayer insulating film 16 and the structure 20 in the hollow portion (i.e., the inner circumferential surface of the structure 20). On the other hand, light incident on the outer circumferential surface of the structure 20 is totally reflected there and hence is lowered in the probability that it shines on the PD 10 located under the structure 20.

First-layer interconnections M1 which are made of a conductive material such as aluminum are formed on the interlayer insulating film 16. The first-layer interconnections M1 are buried in the interlayer insulating film 17. For example, the first-layer interconnections M1 include interconnections that connect the floating diffusions FD and the signal reading circuits C.

Second-layer interconnections M2 which are made of a conductive material such as aluminum are formed on the interlayer insulating film 17. The second-layer interconnections M2 are buried in the interlayer insulating film 18. For example, the second-layer interconnections M2 include interconnections that are connected to the gate electrodes TG, interconnections that are connected to the gate electrodes of the reset transistors, and interconnections that are connected to the gate electrodes of the row-selection transistors.

Third-layer interconnections M3 which are made of a conductive material such as aluminum are formed on the interlayer insulating film 18. The third-layer interconnections M3 are buried in the interlayer insulating film 19. For example, the third-layer interconnections M3 include interconnections that are connected to the gate electrodes TG, interconnections that are connected to power lines that are connected to the reset transistors and the output transistors and the signal output lines that are connected to the row-selection transistors. The third-layer interconnections M3 also serve as a light shield film for preventing entrance of light into regions other than the PDs 10. A configuration is possible in which the third-layer interconnections M3 do not function as interconnections but merely as a light shield film.

As described above, the interlayer insulating films 17-19 which are stacked on the interlayer insulating film 16 include the first-layer interconnections M1, the second-layer interconnections M2, and the third-layer interconnections M3, respectively. The interlayer insulating films 17-19 are made of the same material as the interlayer insulating film 16.

In the above-configured solid-state imaging device 100, since the closed-wall-shaped structures 20 are formed over the respective PDs 10, light that goes toward the PDs 10 after being reflected diffusely by the interconnections M1-M3 and the gate electrodes TG mainly shines on and is reflected by the outer circumferential surfaces of the structures 20. Therefore, the probability that diffusely reflected light shines on each PD 10 can be lowered, whereby the crosstalk can be suppressed and the uniformity of the sensitivities of all the PDs 10 can be increased.

In recent solid-state imaging devices, because of miniaturization, it is difficult to locate the focal points of the microlenses 23 at the topmost surfaces of the respective PDs 10. In the solid-state imaging device 100, the structures 20 are disposed in the one, closest to the PDs 10, of the wiring layers (interlayer insulating films 16-19). Therefore, even if the microlenses 23 are designed so that their focal points are located somewhat above the surface of the semiconductor substrate 14, most of light that comes from each focal point can enter the hollow portion of the associated structure 20. As a result, the light collection efficient can be made sufficiently high even if the focal length of the microlenses 23 can be set short.

In recent solid-state imaging devices, the PDs 10 are reduced in size because of miniaturization. However, to secure a necessary drive voltage, the area of the gate electrodes TG cannot be made smaller than a certain limit value. That is, in CMOS image sensors that are miniaturized to a very large extent, the gate electrodes TG occupy a large area in the surface of the semiconductor substrate 14. In this connection, the gate electrodes TG are made of a material whose light transmittance varies with wavelength, such as polysilicon. Polysilicon has a characteristic that light having a longer wavelength is transmitted more.

Therefore, if the solid-state imaging device 100 were configured so as not to be equipped with the closed-wall-shaped structures 20, each PD 10 over which a G color filter is laid and that is adjacent to a PD 10 over which an R color filter is laid and each PD 10 over which a G color filter is laid and that is adjacent to a PD 10 over which a B color filter is laid are different in the degree of color contamination due to oblique incidence light. Such color contamination varies in degree with the color of a subject and hence is difficult to compensate for.

In the solid-state imaging device 100, the closed-wall-shaped structures 20 are formed in the same layer as the gate electrodes TG, which means that the gate electrodes TG are disposed close to the closed-wall-shaped structures 20. Therefore, oblique incident light occurring when light passes through the gate electrodes TG tends to shine on the outer circumferential surfaces of the structures 20. Therefore, the probability that oblique incident light that is produced when light that has passed through the color filter located over a certain PD 10 and shines on a gate electrode TG then shines on the adjacent PD 10 can be reduced to suppress color contamination.

Since the closed-wall-shaped structures 20 are made of a nonconductive material, no parasitic capacitances occur between the structures 20 and the gate electrodes TG even though the structures 20 are disposed close to the gate electrodes TG. Thus, the closed-wall-shaped structures 20 do not affect the drive voltage of the transfer transistors.

Unlike optical waveguides having the conventional structure, the height of the closed-wall-shaped structure 20 is smaller than their width and hence the closed-wall-shaped structure 20 can be completed before formation of the interlayer insulating film 16. As such, the closed-wall-shaped structure 20 can be manufactured more easily than common waveguide structures. The solid-state imaging device 100 can thus be reduced in cost.

Furthermore, the solid-state imaging device 100 is configured in such a manner that one floating diffusion FD is shared by two PDs 10. Therefore, when compared with CMOS image sensors in which one floating diffusion is provided for each PD, as seen from FIG. 2, the distance between a certain PD 10 and the PD 10 that is adjacent to the former with the floating diffusion FD interposed in between is made shorter. That is, in the configuration in which one floating diffusion FD is shared by two PDs 10, color contamination due to the gate electrodes TG tends to be more remarkable. Therefore, the use of the closed-wall-shaped structure 20 is particularly effective. Incidentally, the problems described in this specification also occur in CMOS sensors that are configured in such a manner that one floating diffusion is provided for each PD. It is therefore effective to apply the concept of the embodiment to those CMOS sensors.

Figure 3:
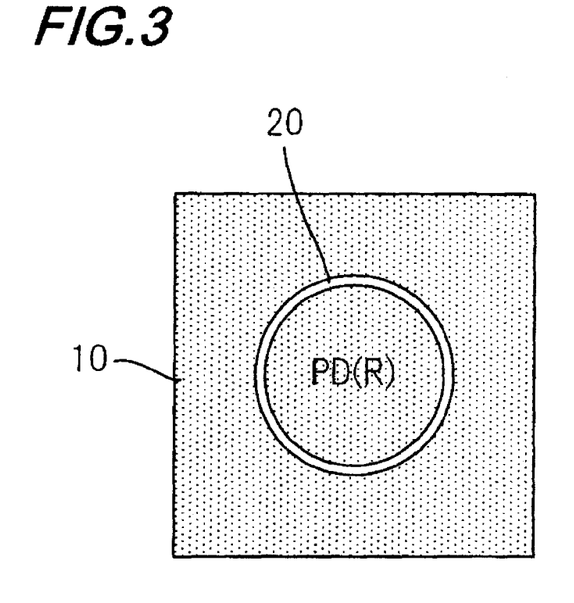
FIG. 3 shows a modification of a closed-wall-shaped structure 20 shown in FIG. 1.

The term "closed-wall-shaped structure" as used in this specification include structures that are circular, elliptical, polygonal, etc. in cross section. Although in the example of FIG. 1 the structures 20 are square (or rectangular) in cross section, they may be cylindrical (circular in cross section) as shown in FIG. 3.

Figure 4:
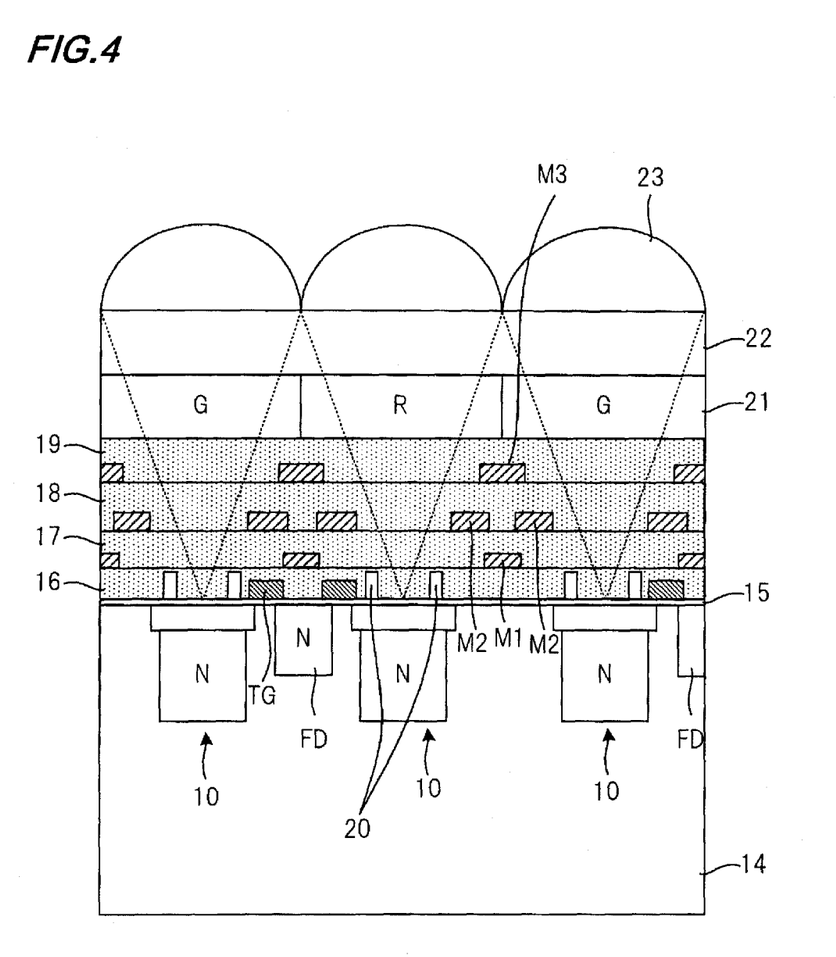
FIG. 4 is a sectional view corresponding to FIG. 2 and showing a modification.

As illustrated in FIG. 4, it is preferable that the height of the closed-wall-shaped structure 20 be greater than that of the gate electrodes TG. Since the closed-wall-shaped structure 20 needs to be made of a nonconductive material, they cannot be formed at the same time as the gate electrodes TG. In other words, the closed-wall-shaped structure 20 can be designed freely in terms of its height. Setting the height of the closed-wall-shaped structure 20 greater than that of the gate electrodes TG can enhance the light collection effect, the color contamination preventing effect, and the sensitivity uniformity increasing effect.

Figure 5:
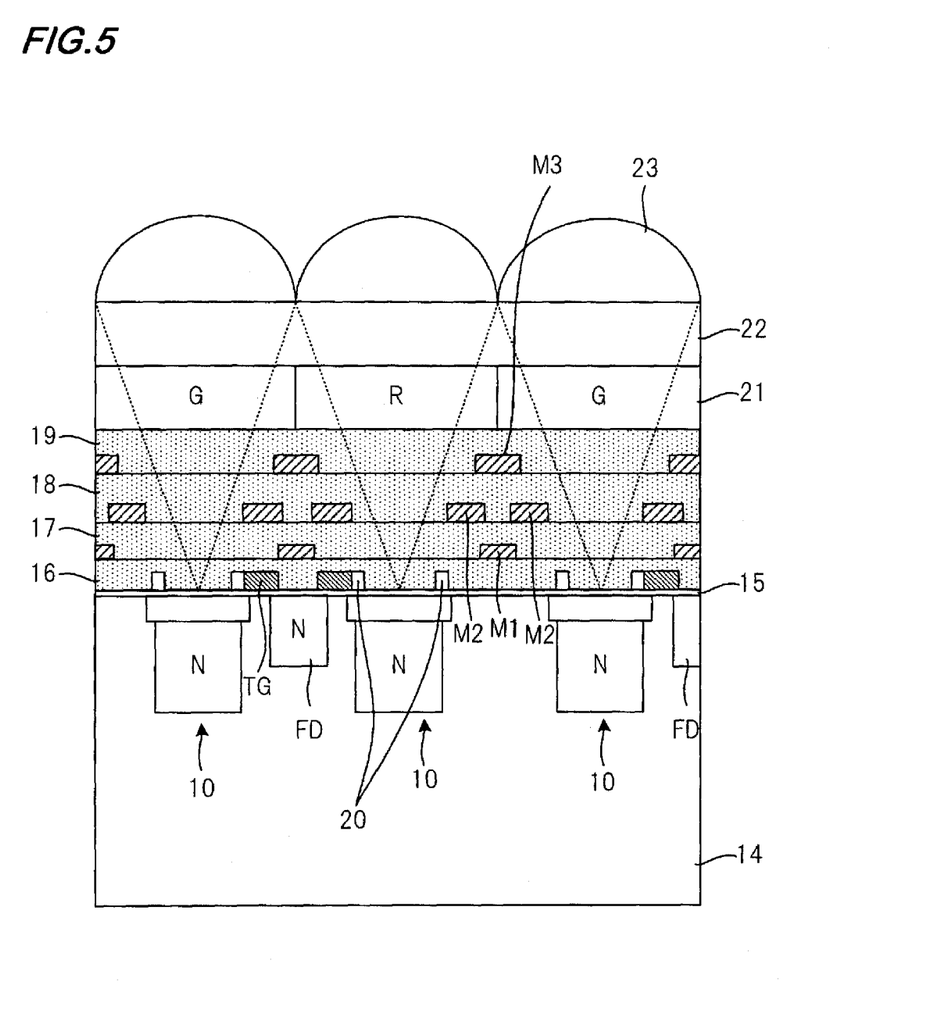
FIG. 5 is a sectional view corresponding to FIG. 2 and showing another modification.

As shown in FIG. 5, the closed-wall-shaped structure 20 may be in contact with the gate electrodes TG. In this case, the probability that light that has passed through a gate electrode TG shines on a PD can be reduced further to suppress color contamination more reliably.

Figure 6:
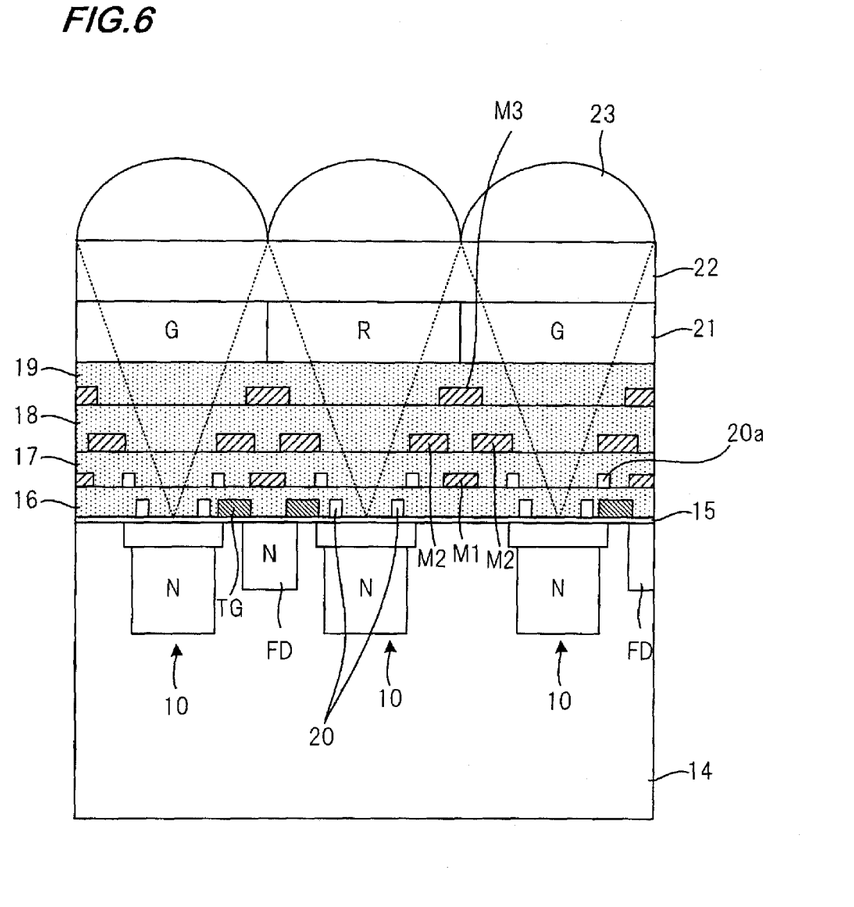
FIG. 6 is a sectional view corresponding to FIG. 2 and showing another modification.

FIG. 6 is a sectional view corresponding to FIG. 2 and showing another modification.

The configuration of FIG. 6 is the same as that of FIG. 2 except that closed-wall-shaped structure 20a that are the same in function and structure as the closed-wall-shaped structure 20 are also formed over the respective PDs 10 in the same layer as the interconnections M1 are formed.

In the configuration of FIG. 6, because of the presence of the closed-wall-shaped structure 20a, the phenomenon that light that has been reflected by the interconnections M1-M3 shines on the PDs 10 can be prevented more reliably. Therefore, the configuration of FIG. 6 can make the sensitivity uniformity increasing effect and the color contamination preventing effect in each PD 10 higher than the configuration of FIG. 2.

Figure 7:
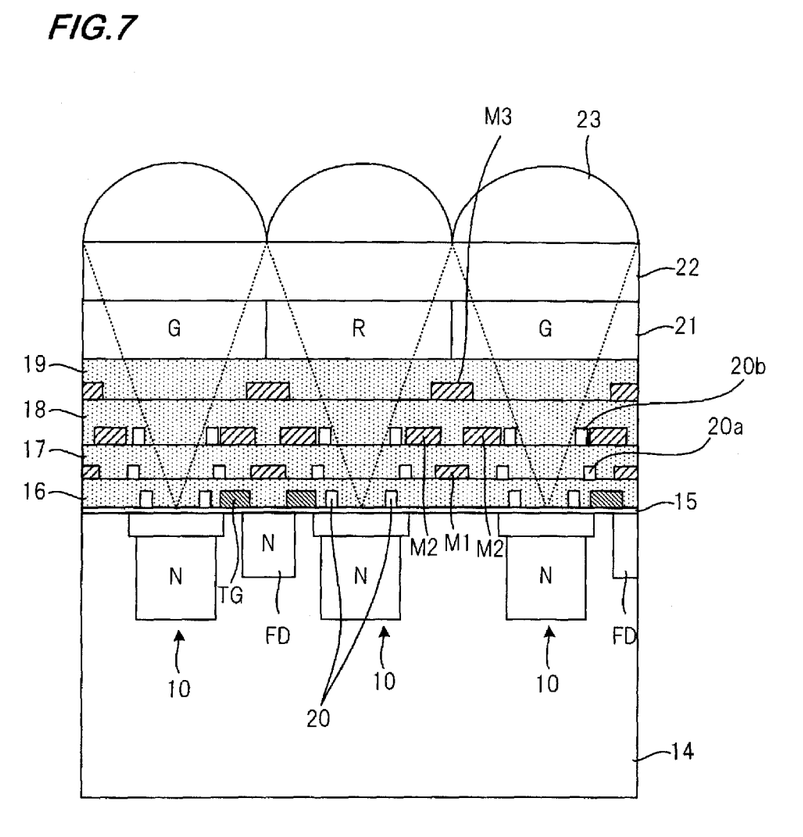
FIG. 7 is a sectional view corresponding to FIG. 2 and showing still another modification.

FIG. 7 is a sectional view corresponding to FIG. 2 and showing still another modification.

The configuration of FIG. 7 is the same as that of FIG. 6 except that closed-wall-shaped structure 20b that are the same in function as the closed-wall-shaped structure 20 are also formed over the respective PDs 10 in the same layer as the interconnections M2 are formed.

In the configuration of FIG. 7, because of the presence of the closed-wall-shaped structure 20b, the phenomenon that light that has been reflected by the interconnections M1-M3 shines on the PDs 10 can be prevented even more reliably. Therefore, the configuration of FIG. 7 can make the sensitivity uniformity increasing effect and the color contamination preventing effect in each PD 10 higher than the configuration of FIG. 6.

Figure 8:
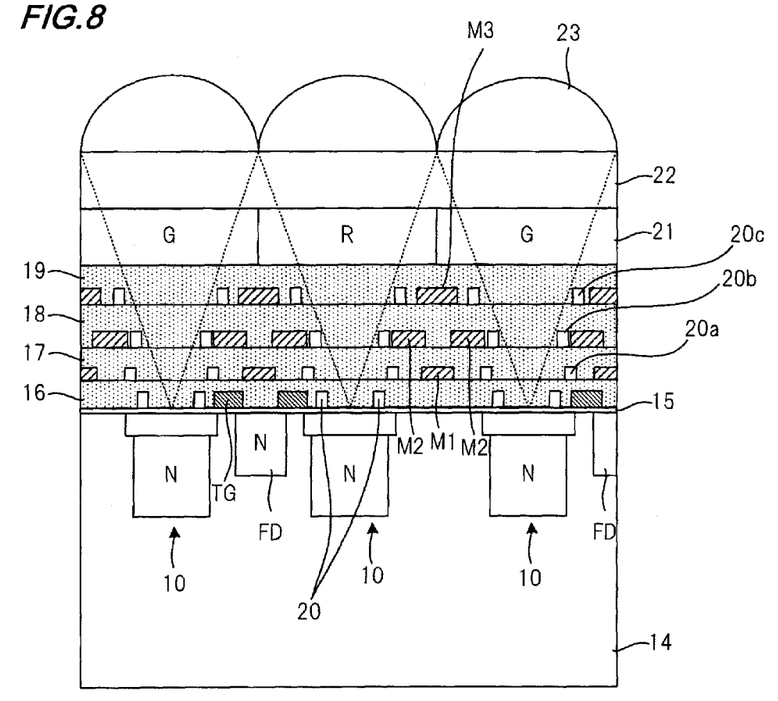
FIG. 8 is a sectional view corresponding to FIG. 2 and showing yet another modification.

FIG. 8 is a sectional view corresponding to FIG. 2 and showing yet another modification.

The configuration of FIG. 8 is the same as that of FIG. 7 except that closed-wall-shaped structure 20c that are the same in function as the closed-wall-shaped structure 20 are also formed over the respective PDs 10 in the same layer as the interconnections M3 are formed.

In the configuration of FIG. 8, because of the presence of the closed-wall-shaped structure 20c, the phenomenon that light that has been reflected by the interconnections M1-M3 shines on the PDs 10 can be prevented even more reliably. Therefore, the configuration of FIG. 8 can make the sensitivity uniformity increasing effect and the color contamination preventing effect in each PD 10 higher than the configuration of FIG. 7.

The effect of preventing the phenomenon that light that has been reflected diffusely by the interconnections M1-M3 shines on the PDs 10 (sensitivity uniformity increasing effect) can be obtained even by a configuration obtained by omitting the structures 20 in FIG. 6, 7, or 8, a configuration obtained by omitting the structures 20a in FIG. 7 or 8, or a configuration obtained by omitting the structures 20 and the structures 20a or 20b in FIG. 8.

Although in the above description the interlayer insulating films 16-19 are oxide films and the closed-wall-shaped structure 20a-20c are nitride films, the invention is not limited to such a case. For example, a configuration is possible in which the interlayer insulating films 16-19 are nitride films and the closed-wall-shaped structure 20a-20c are oxide films. It suffices that the structures 20 and 20a-20c be made of a nonconductive material, and they need not always be nitride films or oxide films.

Figure 9:
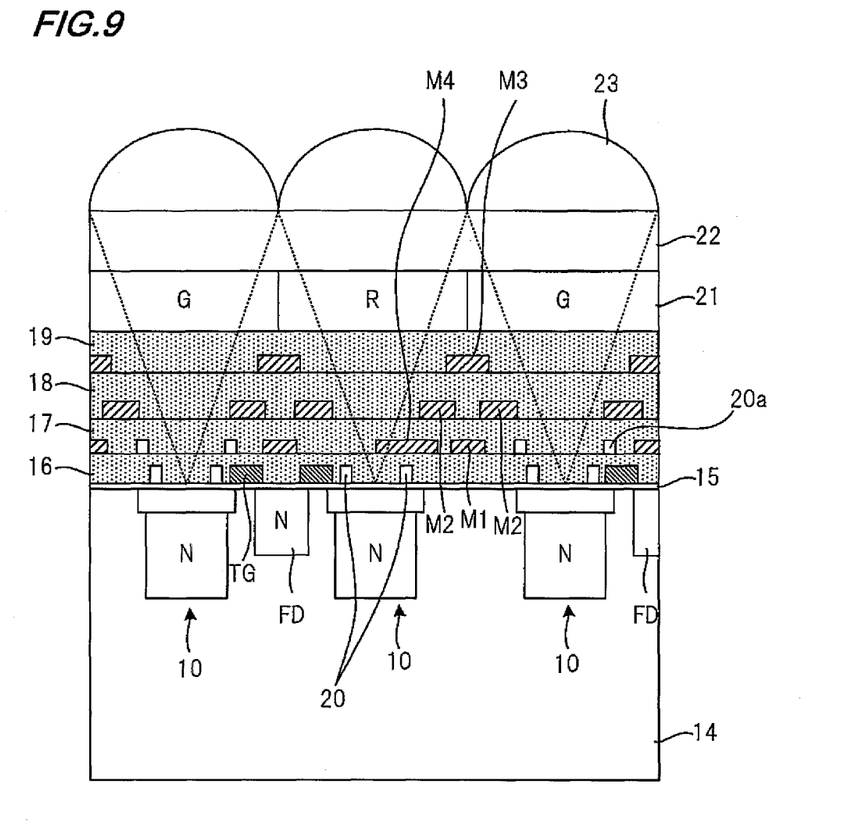
FIG. 9 is a sectional view corresponding to FIG. 2 and showing a further modification.

FIG. 9 is a sectional view corresponding to FIG. 2 and showing a further modification.

The example of FIG. 9 is obtained by removing the structures 20b and 20c which are located over the respective PDs 10 and light shield films M4 are formed on the interlayer insulating film 16 at such positions deviated from the centers of PDs 10 located at particular positions, respectively, as to interrupt parts of optical paths formed by the microlenses 23 located over those respective PDs 10.

Because of the presence of the light shield films M4, the PD 10 located below each light shield film M4 receives part of a light beam that passes through the pupil region of the photographing lens of an imaging apparatus. The solid-state imaging device includes pixels in each of which the position of the light shield film M4 is inverted in the left-right direction in FIG. 9. Phase difference information can be detected by a pair of pixels each of which is provided with the light shield film M4. The manners of arrangement of the structures described above with reference to FIGS. 2-8 can also be applied to solid-state imaging devices capable of both of imaging and phase difference detection. However, structures need not be formed in the layer in which the light shield films M4 are formed.

As described above, this specification discloses the following items:

A solid-state imaging device is disclosed which has plural photoelectric conversion portions arranged two-dimensionally in a semiconductor substrate, and signal reading circuits formed as MOS transistors in the semiconductor substrate, for reading out charges generated in the plural respective photoelectric conversion portions, and comprises microlenses formed over the plural respective photoelectric conversion portions, for focusing light beams on the respective photoelectric conversion portions; an insulating layer which is formed between the semiconductor substrate and the microlenses and in which interconnections are buried; and closed-wall-shaped structures disposed in the insulating layer so as to surround parts of optical paths of light beams focused by the microlenses, respectively, wherein a width of each of the closed-wall-shaped structures in a direction parallel with a surface of the semiconductor substrate is greater than its height in a direction perpendicular to the semiconductor substrate; and wherein the closed-wall-shaped structures are made of a nonconductive material that is different in refractive index from a material of what is formed around them.

A solid-state imaging device is disclosed further comprising color filters arranged in mosaic form and disposed between the photoelectric conversion portions and the microlenses corresponding to the photoelectric conversion portions, respectively; charge storage portions which are formed in the semiconductor substrate and connected to the signal reading circuits, and to which charges stored in the photoelectric conversion portions are transferred; and transfer electrodes formed in the insulating layer, for transferring charges from the photoelectric conversion portions to the charge storage portions, wherein the transfer electrodes are made of a material whose light transmittance varies with the wavelength of incident light; and the closed-wall-shaped structures are formed in the same layer as the transfer electrodes.

A solid-state imaging device is disclosed wherein part of each of the closed-wall-shaped structures is in contact with the associated transfer electrodes.

A solid-state imaging device is disclosed wherein the closed-wall-shaped structures are greater in height than the transfer electrodes.

A solid-state imaging device is disclosed wherein plural interlayer insulating films which are formed above the transfer electrodes and in which interconnections are formed are stacked on the insulating layer; and wherein closed-wall-shaped structures are further disposed in at least one of the plural interlayer insulating films so as to surround parts of the optical paths of light beams focused by the microlenses, respectively.

A solid-state imaging device is disclosed wherein each of the charge storage portions is provided so as to correspond to plural ones of the photoelectric conversion portions.

A solid-state imaging device is disclosed wherein the insulating layer is an oxide film or a nitride film; and wherein the closed-wall-shaped structures are nitride films or oxide films.

An imaging apparatus is disclosed comprising any of the above solid-state imaging devices.

INDUSTRIAL APPLICABILITY

The solid-state imaging device and the imaging apparatus incorporating it enable high speed driving while realizing high uniformity of sensitivities and high light collection efficiency.

Although the invention has been described in detail by referring to the particular embodiments, it is apparent to those skilled in the art that various changes and modifications are possible without departing from the spirit and scope of the invention.

The present application is based on Japanese Patent Application No. 2011-211337 filed on Sep. 27, 2011, the disclosure of which is incorporated herein by reference.

DESCRIPTION OF SYMBOLS

100: Solid-state imaging device
10: PD (photodiode)
14: Semiconductor substrate
16: Interlayer insulating film
20: Closed-wall-shaped structure
23: Microlens
C: Signal reading circuit

The invention claimed is:

1. A solid-state imaging device having plural photoelectric conversion portions arranged two-dimensionally in a semiconductor substrate, and signal reading circuits formed as MOS transistors in the semiconductor substrate, for reading out signals corresponding to charges generated in the plural respective photoelectric conversion portions, comprising:

microlenses formed over the plural respective photoelectric conversion portions, for focusing light beams on the respective photoelectric conversion portions;

color filters arranged in mosaic form and disposed between the photoelectric conversion portions and the microlenses corresponding to the photoelectric conversion portions, respectively;

an insulating layer which is formed between the semiconductor substrate and the microlenses and in which interconnections are buried;

charge storage portions which are formed in the semiconductor substrate and connected to the signal reading circuits, and to which charges stored in the photoelectric conversion portions are transferred;

transfer electrodes formed in the insulating layer, for transferring charges from the photoelectric conversion portions to the charge storage portions; and closed-wall-shaped structures disposed in the insulating layer so as to surround parts of optical paths of light beams focused by the microlenses, respectively, wherein:

each of the charge storage portions is provided so as to correspond to plural ones, formed under color filters of different colors, of the photoelectric conversion portions;

the closed-wall-shaped structures and the transfer electrodes are formed on the semiconductor substrate with a gate insulating film interposed in between;

the insulating layer is a stack of a lowest interlayer insulating film in which the closed-wall-shaped structures and the transfer electrodes are formed and plural interlayer insulating films which are formed above the lowest interlayer insulating film and in which interconnections are formed;

a width of each of the closed-wall-shaped structures in a direction parallel with a surface of the semiconductor substrate is greater than its height in a direction perpendicular to the semiconductor substrate, and the closed-wall-shaped structures are made of a nonconductive material that is different in refractive index from a material of what is formed around them; and the transfer electrodes are made of a material whose light transmittance varies with the wavelength of incident light and disposed outside walls of the closed-wall-shaped structures, and part of each of the transfer electrodes is in contact with an outer circumferential surface of the associated closed-wall-shaped structure.

2. The solid-state imaging device according to claim 1, wherein the closed-wall-shaped structures are greater in height than the transfer electrodes.

3. The solid-state imaging device according to claim 1, wherein:
the insulating layer is an oxide film or a nitride film; and
the closed-wall-shaped structures are nitride films or oxide films.

4. The solid-state imaging device according to claim 2, wherein:
the insulating layer is an oxide film or a nitride film; and
the closed-wall-shaped structures are nitride films or oxide films.

5. An imaging apparatus comprising the solid-state imaging device according to claim 1.

* * * * *